United States Patent [19]
Hush et al.

[11] Patent Number: 5,349,247
[45] Date of Patent: * Sep. 20, 1994

[54] ENHANCEMENT CIRCUIT AND METHOD FOR ENSURING DIACTUATION OF A SWITCHING DEVICE

[75] Inventors: Glen Hush; Mark R. Thomann, both of Boise, Id.

[73] Assignee: Micron Technology, Inc., Boise, Id.

[*] Notice: The portion of the term of this patent subsequent to Jul. 7, 2009 has been disclaimed.

[21] Appl. No.: 893,880

[22] Filed: Jun. 5, 1992

Related U.S. Application Data

[63] Continuation of Ser. No. 618,164, Nov. 28, 1990, Pat. No. 5,128,563.

[51] Int. Cl.$^5$ .............................................. H03K 14/20
[52] U.S. Cl. ................................... 307/451; 307/443; 307/263
[58] Field of Search ............... 307/482, 451, 443, 263, 307/578

[56] References Cited

U.S. PATENT DOCUMENTS

| | | | |
|---|---|---|---|
| 3,859,640 | 1/1975 | Eberlein et al. | 340/173 DR |
| 4,172,282 | 10/1979 | Aichelmann, Jr. | 364/200 |
| 4,238,842 | 12/1980 | Aichelmann, Jr. | 365/222 |
| 4,406,013 | 9/1983 | Reese et al. | 377/29 |
| 4,468,759 | 8/1984 | Kung et al. | 365/201 |
| 4,546,276 | 10/1985 | Freyman et al. | 307/482 |
| 4,689,505 | 8/1987 | Ghosal | 307/578 |
| 4,692,638 | 9/1987 | Stiegler | 307/578 |
| 4,706,221 | 11/1987 | Satoh et al. | 365/222 |
| 4,772,812 | 9/1988 | Desmarais | 307/482 |
| 4,792,891 | 12/1988 | Baba | 364/200 |
| 4,806,798 | 2/1989 | Kanauchi | 307/482 |
| 4,827,453 | 5/1989 | Sawada et al. | 365/222 |
| 4,881,205 | 11/1989 | Aihara | 365/222 |
| 4,894,559 | 1/1990 | Kaneko | 307/578 |
| 4,914,323 | 4/1990 | Shigata | 307/481 |
| 4,961,167 | 10/1990 | Kumanoya et al. | 365/189.09 |
| 4,983,860 | 1/1991 | Yim et al. | 307/481 |
| 5,036,222 | 7/1991 | Davis | 307/451 |
| 5,089,722 | 2/1992 | Amadeo | 307/451 |
| 5,128,563 | 7/1992 | Hush et al. | 307/482 |

*Primary Examiner*—Edward P. Westin
*Assistant Examiner*—Andrew Sanders
*Attorney, Agent, or Firm*—Susan B. Collier

[57] ABSTRACT

An output driver circuit of a DRAM is wired in a push-pull arrangement. A CMOS transistor arrangement provides a strong output signal. This transistor arrangement comprises the pull-up transistor circuit of the push-pull arrangement. A bootstrap circuit gates the NMOS of the CMOS causing an incremental increase in CMOS drain current. The invention is an enhancement circuit for ensuring the deactuation of the pull-down portion of the push-pull arrangement during the action of the CMOS transistor arrangement.

11 Claims, 3 Drawing Sheets

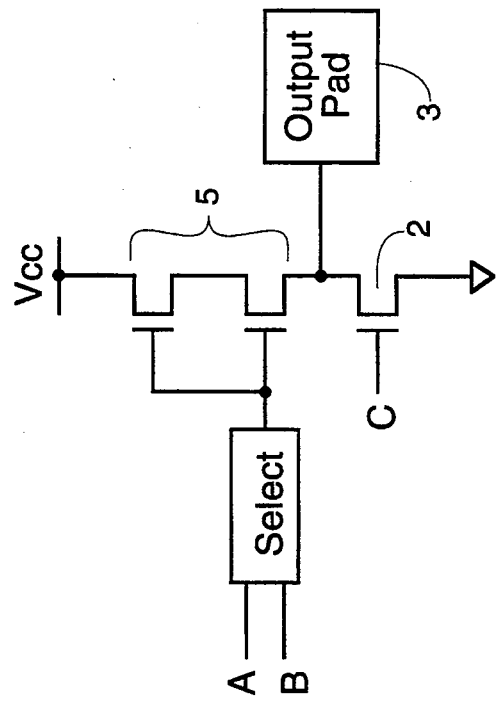
FIG. 1B *(PRIOR ART)*
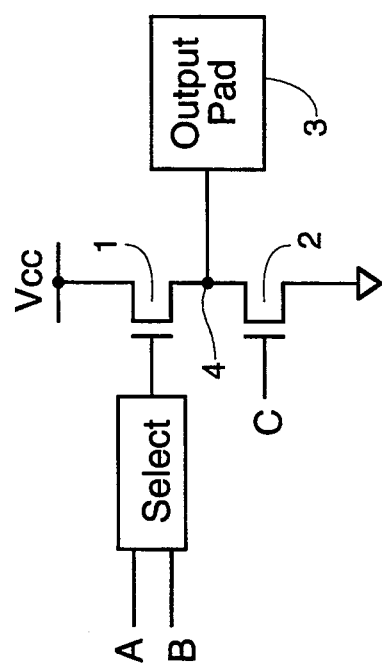
FIG. 1A *(PRIOR ART)*

5,349,247

ENHANCEMENT CIRCUIT AND METHOD FOR ENSURING DIACTUATION OF A SWITCHING DEVICE

CROSS-REFERENCE TO RELATED APPLICATION

This is a continuation to U.S. patent application Ser. No. 7/618,164, filed Nov. 28, 1990 now U.S. Pat. No. 5,128,563.

FIELD OF THE INVENTION

This invention relates to electronic circuits used to provide signal outputs at desired potentials. These circuits are of interest on semiconductor integrated circuits. More particularly, the invention relates to the output driver circuit of a dynamic random access memory device (DRAM.)

BACKGROUND OF THE INVENTION

A (DRAM) stores digital data in an array of memory cells. Each memory cell has a specific address which is essentially the intersection formed by a wordline and a digit line. Once an individual cell has been selected, its true data is amplified and latched onto its digit line by a sense amp. The same sense amp also amplifies and latches the cell's complementary data onto another digit line. Thus, one digit line is high, usually approaching $V_{cc}$, and the other digit line is low, 0 volts.

It is necessary to transfer the data from the digit lines to the output. This data transfer is accomplished by incorporating an output driver circuit into the DRAM. The output driver normally consists of two serially connected NMOS transistors wired in a push-pull arrangement as in FIG. 1A, where A is the data and B is A's complement. C is a control signal. The drain of the pull-up transistor 1 is connected to $V_c$, the source of the pull-down transistor 2 is connected to ground with the output pad 3 connected in parallel from the serial connection 4 to ground. The push-pull arrangement is conducive to low distortion, large load power and high efficiency. A second option for a push-pull circuit configuration is the three serially connected NMOS transistor arrangement shown in FIG. 1B. In this case the output pad 3 remains in parallel with the grounded pull-down transistor 2 and the two upper transistors 5 constitute the pull-up transistor. There are problems encountered in either arrangement. First it is necessary to use large pull up transistors for a total size in the range of 4500 microns. These large transistors require more space. Further, the use of NMOS transistors makes the circuit subject to negative input injection. Large initial drain currents in an output driver circuit are also noise conducive.

SUMMARY OF THE INVENTION

In the preferred embodiment the pull-up transistor of the push-pull arrangement of the DRAM output driver circuit is implemented with a CMOS device, the gates of the CMOS receiving inverted signals insuring that both complementary transistors have the same on-off state. The CMOS comprises a PMOS directly connected to $V_{cc}$ at its drain and an NMOS connected from its source to the drain of an NMOS pull-down transistor. This CMOS design utilizes a 2000 micron PMOS device and a 500 micron NMOS device effecting a considerable die space savings over the conventional NMOS push-pull arrangement. The NMOS transistor of the CMOS is gated by a bootstrapped circuit that initially gates at approximately 5 volts with a subsequent increase to approximately 7 volts. The bootstrap circuit reduces noise due to the two level gate voltage which directly results in a two level drain current. A large initial current is more susceptible to noise than the incremental current increase of the present embodiment. Since a negative input voltage on the output pad will not turn on the PMOS transistor of the CMOS as it can the NMOS transistors of the prior art, there is no negative input injection. The pull-down portion of the circuit comprises an enhancement pull-down device for ensuring that the pull-down portion of the circuit is deactuated during the actuation of the CMOS device.

BRIEF DESCRIPTION OF THE DRAWINGS

FIGS. 1A and 1B are prior art depictions of typical push-pull configurations of a typical output driver circuit.

DETAILED DESCRIPTION OF THE PREFERRED EMBODIMENT

Figure 2:
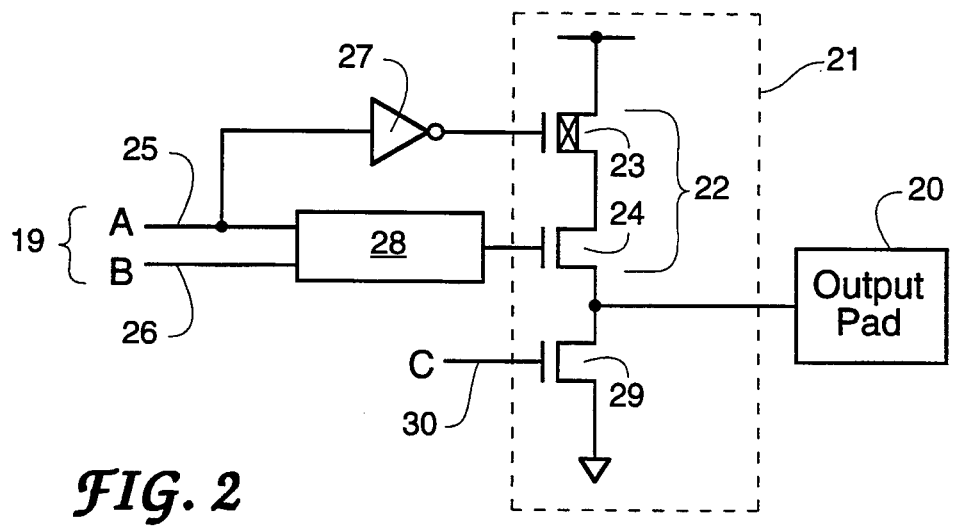
FIG. 2 is a simplified block schematic of the push-pull configuration of the output driver circuit of the present embodiment.

The preferred embodiment of the present invention is an output driver circuit shown simplified in the block schematic of FIG. 2. The preferred embodiment efficiently transfers data from the digit lines 19 of a DRAM to the output pad 20. A push-pull transistor configuration 21 buffers the data to the output to ensure low distortion, high efficiency, and large load power. The pull-up transistor is a CMOS transistor arrangement 22 comprising a PMOS transistor 23 serially connected to an NMOS transistor 24. The use of the CMOS transistor arrangement enhances the circuit by eliminating negative input injection and utilizing smaller transistors. This enhancement is directly a result of the PMOS transistor. The PMOS and the NMOS comprising the CMOS receive complementary gate signals to ensure identical on-off transistor states. The input signal at A 25 represents the selected cell's data. The inverse signal at B 26 represents the data's complement. Input signal 25 and inverse signal 26 gate the CMOS. The PMOS transistor of the CMOS is gated by the input signal through an inverter 27 and the NMOS transistor of the CMOS is gated by the input signal and the inverse signal through the bootstrap circuit 28 configuration. The bootstrap circuit 28 gates the NMOS transistor of the CMOS in at least two incremental steps in order to reduce noise. The PMOS of the CMOS is connected to $V_{cc}$ at its drain and the NMOS of the CMOS is connected at its source to the drain of the NMOS pull-down transistor 29. The pull-down transistor is gated by the control signal C 30. A high input signal is transferred to the output by a low control signal, and a low input signal is transferred to the output by a high control signal. The output is at a high impedance when both the input signal and the control signal are low.

Figure 3:
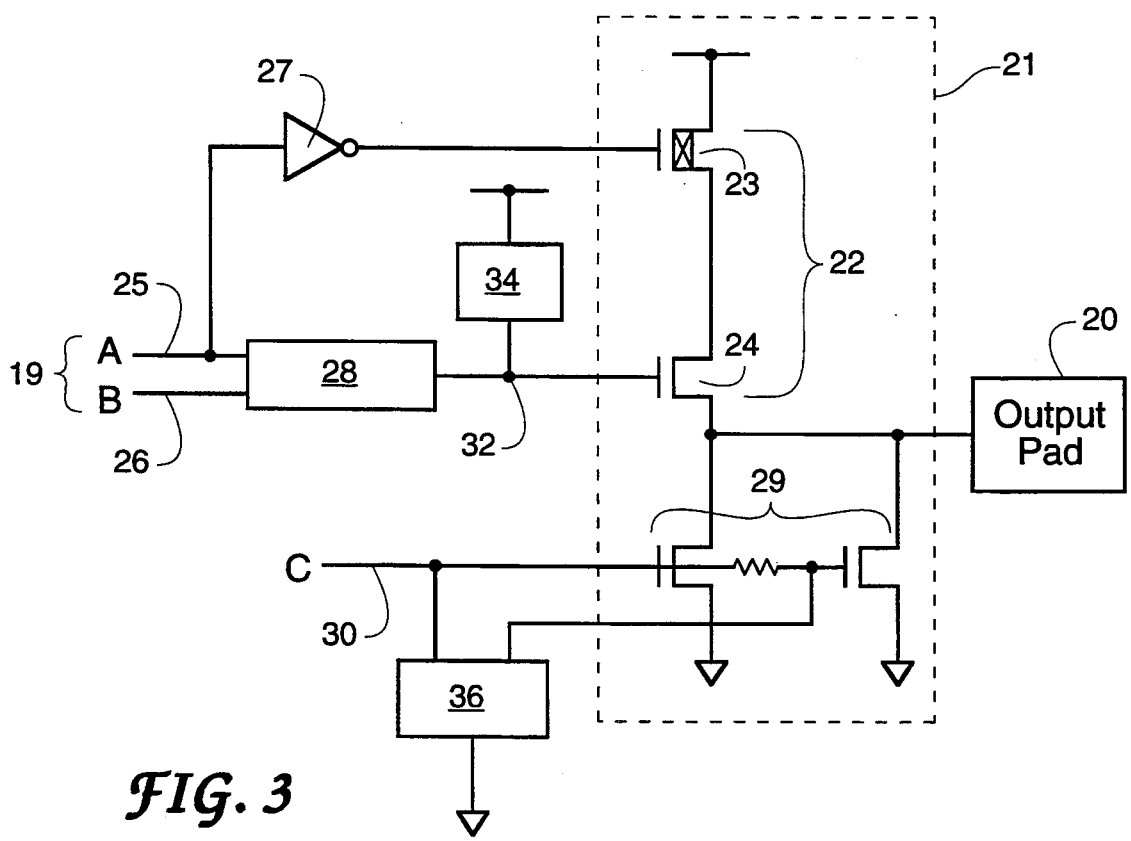
FIG. 3 is a block schematic of the push-pull configuration of the output driver circuit of the present embodiment.

FIG. 3 is a more sophisticated block diagram of the preferred embodiment. A high logic level on the gate node 32 is held high by the pull-up circuit 34 and a low logic level control signal 30 is held low by a pull-down circuit 36. The pull-down transistor 29 may actually be two or more parallel NMOS transistors. "Pull-down" circuit 36 may be responsive to an inverted signal from C or a signal from A.

Figure 4:
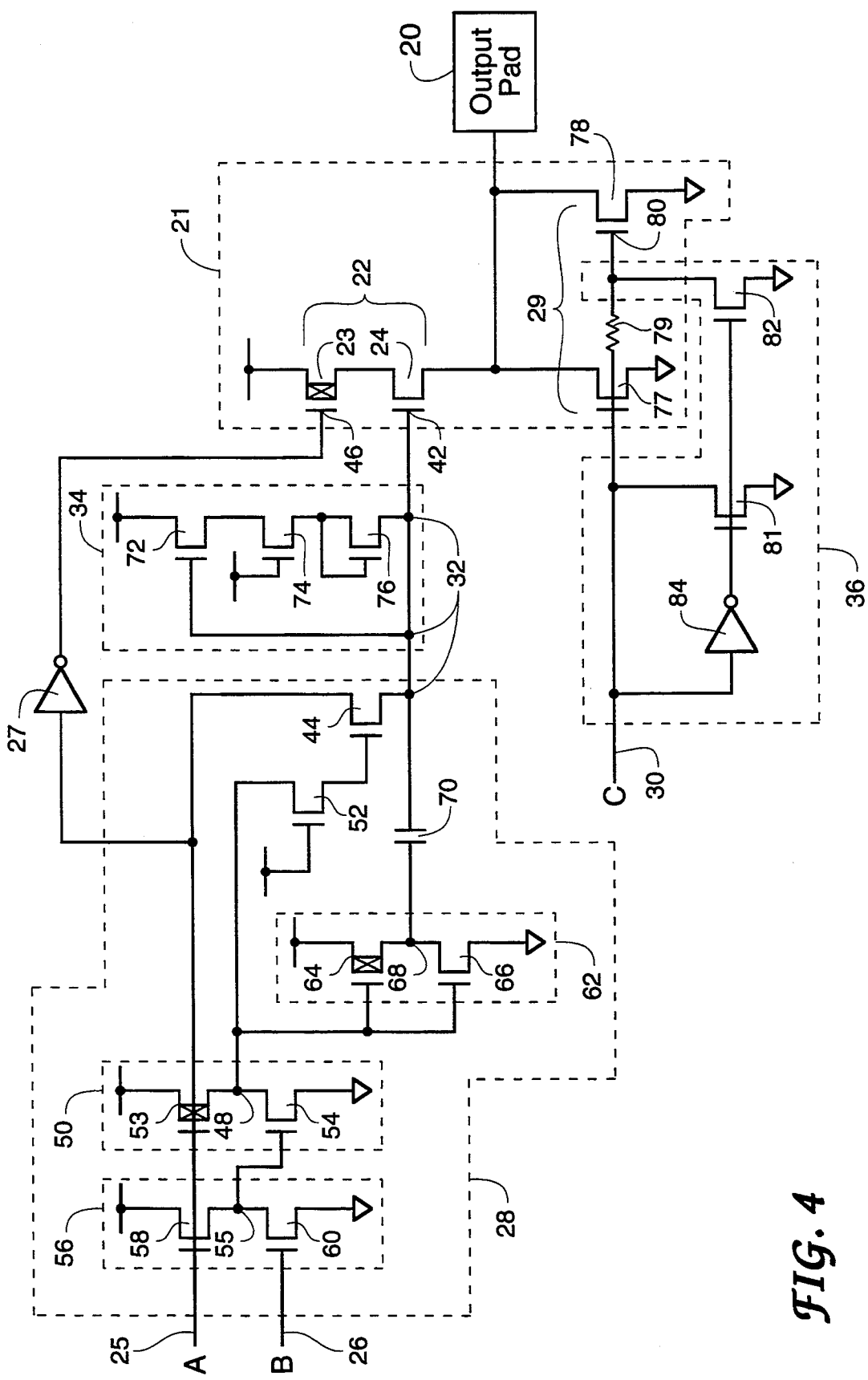
FIG. 4 is a detailed schematic of the push-pull configuration of the output driver circuit of the present embodiment.

The bootstrap configuration 28 of FIG. 3 is shown in more detail in FIG. 4. Gate node 32 activates the gate 42 of NMOS 24. The bootstrap configuration passes a low to the gate node 32 through switching NMOS transistor 44 when the input signal 25 is low and the inverse signal 26 is high. This low at gate 42 turns off transistor 24. The low input signal is inverted through inverter 27 to pass a high to the gate 46 of transistor 23 turning it off. Switching NMOS transistor 44 is gated by a signal from the serial connection output 48 of a subsequent MOS transistor pair 50 through a continually gated NMOS transistor 52.

The subsequent MOS transistor pair comprises a PMOS 53 and an NMOS 54 serially connected at the serial connection output 48. The PMOS 53 drain is connected to $V_{cc}$ and the NMOS 54 source is connected to ground. The PMOS 53 is gated directly from the input signal 25. The NMOS 54 is gated from the serial output 55 of an initial NMOS transistor pair 56 having a first initial NMOS transistor 58 whose drain is connected to $V_{cc}$ and having a second initial NMOS transistor 60 whose source is connected to ground. First initial NMOS transistor 58 is gated by input signal 25 and second initial NMOS transistor 60 is gated by the inverse signal 26. A low on the input signal 25 turns off the first initial NMOS transistor 58 and a high on the inverse signal 26 turns on the second initial NMOS transistor 60 taking the serial output 55 low. The low on the serial output 55 turns off the NMOS 54 and the low on the input signal 25 turns on the PMOS transistor 53 taking the serial connection output 48 high. The high serial connection output 48 then passes through the continually gated NMOS transistor 52 to gate the switching NMOS transistor 44. Thus, the low input signal is passed through the switching NMOS transistor 44 to the gate node 32.

In addition to gating the switching transistor 44, the serial connection output 48 gates a commonly gated MOS transistor pair 62. The commonly gated MOS transistor pair 62 consists of a PMOS transistor 64 and an NMOS transistor 66 serially connected at a serial node 68. The PMOS 64 and the NMOS 66 have opposite on-off states. The PMOS 64 drain is connected to $V_{cc}$ and the NMOS 66 source is connected to ground. A capacitor 70 is connected between the serial node 68 and the gate node 32. When the input signal 25 is low, the gate node 32 is low and the serial node 68 is low. The low input signal causes the serial node to go low by passing a high to the gate of NMOS transistor 66 turning it on and shorting the serial node 68 to ground. The identical low potentials seen by the capacitor 70 keep it from charging.

When the input signal fires from a low to a high, the switching transistor 44 remains on and the high is felt at the gate node 32. The serial node 68 remains low during a three gate time delay and the capacitor charges. The high seen on the gate node 32 turns on the NMOS 24 of the CMOS transistor arrangement 22. The high input signal is also inverted at the inverter 27 turning on the PMOS 23 of said CMOS transistor arrangement 22. The high input signal turns on first initial NMOS transistor 58 allowing a high on the gate of transistor 54. NMOS Transistor 54 turns on, taking the serial connection output 48 to a low. The low is passed through the continually gated transistor 52 to turn off the switching transistor 44, thus isolating the high on the gate node after a delay time due to the on-off change of state of three transistors.

The low at the serial connection output 48 due to the high input signal turns on PMOS transistor 64, thus taking the serial node 68 high after a time delay equal to the time it took for three transistors to change on-off states. The high on the serial node 68 coupled with the high on the gate node 32 boots the capacitor 70 to a higher potential, approximately 7 volts. This increase in potential on the capacitor results in a corresponding increase in potential on the gate node 32. Transistor 24 is bootstrapped to the capacitor potential. That is, since the gate node potential follows the capacitor potential, the transistor is turned on harder with an increase in capacitor potential, meaning it is made to conduct more drain current than would be possible if the increase in potential were not present. PMOS transistor 23 remains on due to the inverted high input signal. Since the drain current increases incrementally, the circuit is subject to considerably less noise than if the current were to go high initially.

An NMOS transistor 72 is gated by the gate node 32 and is connected to $V_{cc}$ at its drain. The NMOS transistor 72 is serially connected at its source to the drain of a continuously gated NMOS transistor 74. The continuously gated NMOS transistor 74 in turn is connected serially from its source to a diode 76. A high on the gate node 32 turns on the transistor 72, pulling the gate node 32 to a high $V_{cc}$ through the diode 76, the continuously gated NMOS transistor 74, and the NMOS transistor 72. The transistors 72 and 74 and diode 76 constitute the pull-up device 34.

In the preferred embodiment two parallel NMOS transistors 77 and 78 comprise pull-down transistor 29. NMOS transistor 77 is gated directly by the control signal 30 and NMOS transistor 78 is gated by the control signal 30 through a resistor 79 connected serially between the gate 80 of the transistor 78 and the control signal 30. The drains of the NMOS transistors 77 and 78 are connected to the source of the CMOS pull-up transistor 22. The sources of the NMOS transistors 77 and 78 are connected to ground.

Two parallel NMOS transistors 81 and 82, and inverter 84 comprise a pull-down device 36. The NMOS transistors 80 and 81 are connected to the control signal 30 at their drains and to ground at their sources. A low on the control signal 30 is inverted to the gates of the NMOS transistors 78 and 80, turning them on and keeping the control signal low.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. The output driver circuit, comprising:
   a) an output node;
   b) a reference node capable of being connected to a reference potential;
   c) a first switching device operatively interposed between said output node and said reference node and actuated at a control input in response to a first signal thereby driving a potential of said output node toward a potential of said reference node, and said first switching device deactuated at said control input in response to a second signal thereby interrupting a current between said output node and the reference node;

d) a second switching device operatively interposed between said output node and said reference node and actuated at a control input in response to said first signal thereby driving a potential of said output node toward a potential of said reference node, and said second switching device deactuated at said control input in response to said second signal thereby interrupting a current between said output node and the reference node;

e) a first enhancement switching device electrically interposed between said control input of said first switching device and said reference node, said first enhancement switching device actuated in response to said second signal thereby driving a potential of said control input of said first switching device to a value capable of deactuating said first switching device thereby ensuring the deactuation of said first switching device; and f) a second enhancement switching device electrically interposed between said control input of said second switching device and said reference node, said second enhancement switching device actuated in response to said second signal thereby driving a potential of said control input of said second enhancement switching device to a value capable of deactuating said second switching device, thereby ensuring the deactuation of said second switching device.

2. A method of driving a potential to an output node, comprising:
   a) deactuating a first switching device with a pull-down signal at a control node of said first switching device;
   b) driving a potential of said control node of said first switching device to a pull-down potential capable of deactuating said first switching device, to further ensure said step of deactuating of said first switching device;
   c) deactuating a second switching device with said pull-down signal at a control node of said second switching device;
   d) driving a potential of said control node of said second switching device to said pull-down potential, said pull-down potential capable of deactuating said second switching device, to further ensure said step of deactuating of said second switching device;
   e) interrupting a current through said first switching device as a result of said step of deactuating said first switching device; and
   f) interrupting a current through said second switching device as a result of said step of deactuating said second switching device.

3. The method as specified in claim 2, wherein said step of driving said potentials of said control nodes of said first and said second switching devices comprises driving said potentials of said control nodes to a reference potential.

4. The output driver as specified in claim 1, further comprising an inverter circuit for inverting said first and said second signals to said control inputs of said first and said second enhancement switching devices.

5. The method as specified in claim 2, wherein said steps of driving said potentials of said control nodes of said first and said second switching devices comprises actuating a first pull-down device and a second pull-down device, respectively, in response to said pull-down signal.

6. The method as specified in claim 5, further comprising:
   a) inverting said pull-down signal; and
   b) actuating said first and said second pull-down device with said inverted pull-down signal.

7. An output driver circuit, comprising:
   a) an output node;
   b) a supply node, connectable to a supply potential;
   c) an initial switching device operatively interposed between said supply node and said output node;
   d) a series switching device serially connected to said initial switching device and in electrical communication with said supply node, said series switching device being actuated in conjunction with said initial switching device being actuated in order to drive said potential of said output node toward the supply potential when said supply node is coupled to the supply potential;
   e) a reference node capable of being connected to a reference potential;
   f) a pull-down switching device operatively interposed between said output node and said reference node and actuated at a control input in response to a first signal thereby driving a potential of said output node toward a potential of said reference node, and said pull-down switching device deactuated at said control input in response to a second signal thereby interrupting a current between said output node and the reference node; and
   g) an enhancement circuit in electrical communication with said control input, said enhancement circuit driving a potential of said control input to a value capable of deactuating said pull-down switching device thereby ensuring the deactuation of said pull-down switching device.

8. The output driver as specified in claim 7, wherein said enhancement circuit is operatively interposed between said control input and said reference node, said signal enhancement circuit driving said potential of said control input to said potential of said reference node during the deactuation of said pull-down switching device.

9. The output driver as specified in claim 7 wherein said enhancement circuit is responsive to said first and said second signals, said enhancement circuit ensuring the deactuation of said pull-down switching device in response to said second signal.

10. A method of driving a potential to an output node, comprising:
   a) electrically interposing an initial switching device between a supply node, connectable to a supply potential, and an output node;
   b) actuating said initial switching device with a first signal;
   c) conducting a first current between said supply node and said output node through said initial switching device;
   d) actuating said initial switching device with a second signal having a potential different than said first signal;
   e) conducting a second current between said supply node and said output node through said initial switching device, said second current being different than said first current;

f) actuating a series switching device in conjunction with said actuating of said initial switching device, said series switching device thereby conducting said first and said second currents in conjunction with said initial switching device conducting said first and said second currents;

g) deactuating a pull-down switching device with a pull-down signal at a control node of said pull-down switching device, during said steps of conducting said first and said second currents;

h) driving a potential of said control node to a pull-down potential capable of deactuating said pull-down switching device, to further ensure said deactuating of said pull-down switching device; and i) interrupting a current through said pull-down switching device as a result of said deactuating.

11. The method as specified in claim 10, wherein said driving of said potential of said control node further comprises driving said potential of said control node to a reference potential during said deactuating of said switching device.

* * * * *